United States Patent
Li et al.

(10) Patent No.: US 9,148,135 B2
(45) Date of Patent: Sep. 29, 2015

(54) REAL TIME AUTOMATIC AND BACKGROUND CALIBRATION AT EMBEDDED DUTY CYCLE CORRELATION

(75) Inventors: Matt Li, Hsinchu (TW); Tsung-Hsien Tsai, Kaohsiung (TW); Mao-Hsuan Chou, Xinfen Township (TW); Min-Shueh Yuan, Taipei (TW); Chih-Hsien Chang, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 385 days.

(21) Appl. No.: 13/532,881

(22) Filed: Jun. 26, 2012

(65) Prior Publication Data

US 2013/0342252 A1 Dec. 26, 2013

(51) Int. Cl.
G06F 1/00 (2006.01)
H03K 5/156 (2006.01)
G06F 1/08 (2006.01)

(52) U.S. Cl.
CPC .............. H03K 5/1565 (2013.01); G06F 1/08 (2013.01)

(58) Field of Classification Search
CPC .................................. G06F 1/00; H03K 3/017
USPC .......................................... 713/500; 327/175
See application file for complete search history.

(56) References Cited

U.S. PATENT DOCUMENTS

| | | | |
|---|---|---|---|
| 6,934,215 B2 | 8/2005 | Chung et al. | |
| 6,981,185 B1 | 12/2005 | Davis et al. | |
| 7,463,075 B2 | 12/2008 | White | |
| 7,489,173 B1 * | 2/2009 | Verma et al. | 327/175 |
| 7,839,195 B1 | 11/2010 | Feng et al. | |
| 8,253,339 B1 * | 8/2012 | Godbole et al. | 315/149 |
| 8,462,906 B1 * | 6/2013 | Ding | 375/355 |
| 2004/0135608 A1 * | 7/2004 | Pillay et al. | 327/175 |
| 2005/0058233 A1 * | 3/2005 | Nguyen et al. | 375/354 |
| 2005/0212575 A1 * | 9/2005 | Kim | 327/158 |
| 2007/0216457 A1 * | 9/2007 | Agarwal et al. | 327/175 |
| 2008/0162062 A1 * | 7/2008 | Kelkar et al. | 702/79 |
| 2008/0272814 A1 * | 11/2008 | Chiang et al. | 327/175 |
| 2010/0007393 A1 * | 1/2010 | Seefeldt | 327/175 |
| 2010/0308878 A1 * | 12/2010 | Feng et al. | 327/156 |
| 2011/0291724 A1 * | 12/2011 | Jain et al. | 327/175 |
| 2012/0250426 A1 * | 10/2012 | Huang | 365/189.07 |
| 2012/0268171 A1 * | 10/2012 | Willey et al. | 327/117 |

* cited by examiner

*Primary Examiner* — Thomas Lee
*Assistant Examiner* — Volvick Derose
(74) *Attorney, Agent, or Firm* — Eschweiler & Associates, LLC

(57) ABSTRACT

The present disclosure relates to a clock generation system. The system includes a clock source, a tuning buffer, an output buffer, a duty cycle measurement circuit and an automatic calibration component. The clock source generates a clock signal. The tuning buffer is configured to generate a corrected clock signal from the clock signal according to adjustment values. The output buffer is configured to generate an output clock signal from the corrected clock signal. The duty cycle measurement circuit is configured measure a duty cycle of the output clock signal. The automatic calibration component is configured to generate the adjustment values according to the duty cycle measurement and the specification values.

20 Claims, 7 Drawing Sheets

600

REAL TIME AUTOMATIC AND BACKGROUND CALIBRATION AT EMBEDDED DUTY CYCLE CORRELATION

BACKGROUND

Clock signals are commonly used in electronic devices for a variety of purposes, including circuit operation, synchronization, and the like. Clock signals are created by a clock generator circuit, which, for a high speed clock generator, includes a ring oscillator.

Clock signals have a number of features or characteristics. These include duty cycle, waveform shape, min/max values, frequency, and the like. For example, waveform shapes include sine waves, square waves, and triangle waves. The duty cycle is the time a signal spends in one state as a fraction of the total time. Thus, for example, a signal that is on half the time, has a duty cycle of 50 percent. Min and max values refer to minimum and maximum amplitude values for the clock signals. The frequency refers to the number of cycles per second.

DETAILED DESCRIPTION

Figure 1:
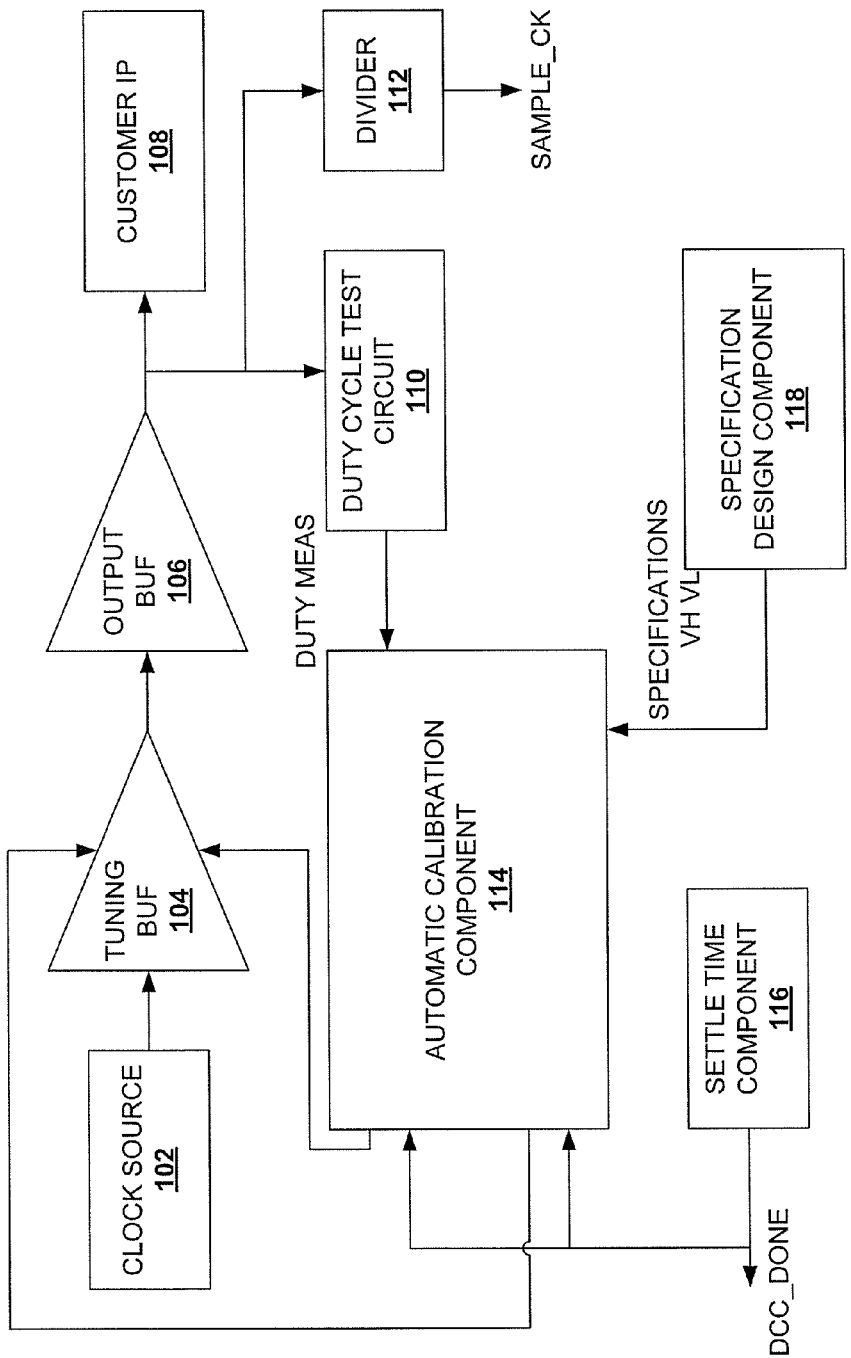
FIG. 1 is a block diagram of a clock system having embedded duty cycle correction in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Clock signals are commonly used in electronic devices for a variety of purposes, including circuit operation, synchronization, and the like. They have a number of features or characteristics including duty cycle, waveform shape, min/max values, frequency, and the like. The duty cycle is the time a signal spends in one state, such as above a zero value, as a fraction of the total time.

Edges of clock signals are often used to trigger actions and/or operations. The edges include rising edges and falling edges. Variations in duty cycle can alter the occurrence of the edges, resulting in undesirable operation. For example, a clock signal used for synchronization based on rising edges.

Variations in duty cycle, referred to as duty cycle distortion, can result in improper operation of devices. Output clocks typically encounter duty cycle distortion, for example, from process corner effects and mismatch effects. These distortions can be within acceptable limits, which generally mean that device operation is not substantially impacted. However, once the distortions exceed acceptable limits, device operation is typically impacted. If duty cycle distortions exceed acceptable limits, correction is needed.

Two existing techniques for correcting duty cycle distortions are an interpolating technique and a digital correction technique. The interpolating technique uses a delayed lock loop and an interpolation circuit. The interpolating technique generally introduces extra jitter to a clock source. Jitter is an undesired deviation from true periodicity of an assumed periodic signal. Additionally, continued tuning consumes extra power. Further, there is a lack of duty measurement result. It is challenging to measure duty cycle of a clock signal without introducing distortions.

The digital correction technique uses a digital to analog converter (DAC) or analog to digital converter (ADC) in a correction loop. A complex digital control circuit (MCU) and algorithm is needed. Thus, expensive circuitry is required.

Some embodiments permit real time correction of duty cycle in accordance with a specification. Further, duty cycle measurement is monitored. A sample clock is generated by a clock source. Leakage current exists when the DCC is complete. Additionally, no jitter is introduced into the clock path.

FIG. 1 is a block diagram of a clock system 100 having embedded duty cycle correction in accordance with some embodiments. The system 100 measures and monitors duty cycle of a clock signal and automatically corrects the duty cycle as needed. The system includes a clock source 102, a tuning buffer 104, an output buffer 106, a customer IP 108, a duty cycle test circuit 110, a divider component 112, an automatic calibration component 114, a settle time component 116 and a specifications design component 118.

The clock source 102 generates a clock signal. The clock source 102 typically comprises a resonant circuit and an amplifier or a ring oscillator (not shown). The clock source generates the clock signal at a selected frequency with a selected waveform and a selected duty cycle. An acceptable duty cycle variation amount or threshold is provided in some embodiments. A high speed clock generator is usually ring oscillator.

The tuning buffer 104 receives the clock signal and performs duty cycle adjustments. The duty cycle adjustments include NMOS driving adjustments and PMOS driving adjustments. The tuning buffer 104 outputs a tuned clock signal.

The output buffer 106 is a buffer and receives the tuned clock signal and generates an output clock signal. The output clock signal is received by the customer IP 108, the duty cycle test circuit 110 and the divider 112.

The divider component 112 divides the output clock signal by a selected amount. The divided signal is output as a sample clock (SAMPLE_CK). The divider component 112 includes a suitable divider circuit.

The duty cycle test circuit 110 receives at least a portion of the output clock signal and measures the duty cycle. The duty cycle test circuit 110 uses a suitable mechanism to measure the duty cycle and then provides the measurement to the automatic calibration component. It is noted that the duty cycle test circuit 110 does not introduce distortions into the output clock signal, such as jitter. In one example, the duty cycle test circuit 110 transforms the output clock signal into a DC voltage.

The specification design component 118 provides specifications to the automatic calibration component 114. The specifications include a voltage high (VH) and a voltage low (VL). These values, VH and VL, represent a range of permitted duty cycle variations. In one example, VH corresponds to +2 percent duty cycle and VL corresponds to −2 percent duty cycle. The values are selected according to factors including, but not limited to, system demand, application requirements, temperature, pressure, and the like. In one example, the values are provided or input.

The settle time component 116 determines when the clock signal or the output clock signal has settled sufficiently. The settle time component 116 provides a signal indicating when settling has occurred, and it is referred to as DCC_DONE. The calibration component 114 avoids providing adjustments to the tuning buffer 104 until settling has occurred. In one example, the DCC_DONE signal remains high after a settling time. In another example, the calibration component 114 is powered down or in a lower power mode on the DCC_DONE signal being high.

The automatic calibration component 114 receives the DCC_done signal, the specifications, and the duty cycle measurements and generates adjustments there from. The calibration component 114 compares the duty cycle measurements with the specifications to determine whether adjustments on upper or lower end voltages are needed. Then, the comparisons are accumulated with the sample clock provided by the divider component 112. Accumulated signals are generated and provided as upper and lower adjustments to the tuning buffer 104.

Figure 2:
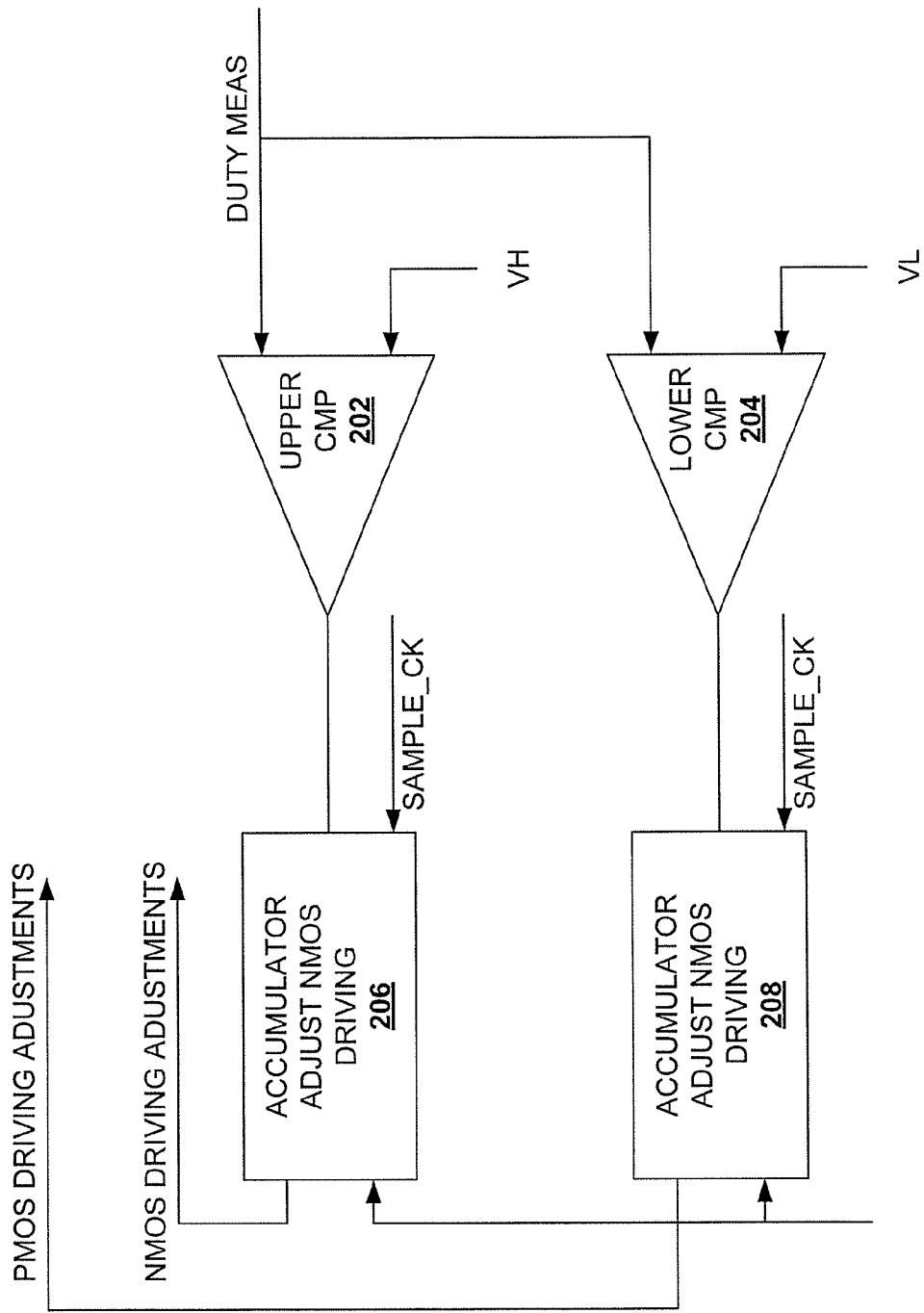
FIG. 2 is a block diagram illustrating an automatic calibration component in accordance with some embodiments.

FIG. 2 is a block diagram illustrating an automatic calibration component 200 in accordance with some embodiments. The component 200 can be utilized in the system 100, described above. The component 200 is described in conjunction with signals, described above with reference to FIG. 1.

The automatic calibration component 200 includes an upper comparator 202, a lower comparator 204, an upper accumulator 206, and a lower accumulator 208. The upper comparator receives a duty measurement signal and VH. The upper comparator 202 compares the duty measurement signal and VH to determine whether the duty measurement signal is greater than the specified limit, VH. An upper comparison signal is generated and provided to the upper accumulator 206.

Similarly, the lower comparator 204 receives the duty measurement signal and VL. The lower comparator 204 compares the duty measurement signal and VL to determine whether the duty measurement signal is less than the specified limit, VL. A lower comparison signal is generated and provided to the lower accumulator 208.

The upper accumulator 206 receives the upper comparison signal and the sample clock and accumulates the values. The upper accumulator 206 generates NMOS driving adjustments from the values. The adjustments are provided when the DCC_DONE signal indicates adjustments are permitted. In one example, the upper accumulator 206 comprises a series of tri-state buffers. The upper comparison signal is sensed using the sample clock (Sample_CK) as a trigger signal.

The lower accumulator 208 receives the lower comparison signal and the sample clock and accumulates the values. The lower accumulator 208 generates PMOS driving adjustments from the values. The adjustments are provided when the DCC_DONE signal indicates adjustments are permitted. In one example, the lower accumulator 208 comprises a series of tri-state buffers. The upper comparison signal is sensed using the sample clock (Sample_CK) as a trigger signal.

Figure 3:
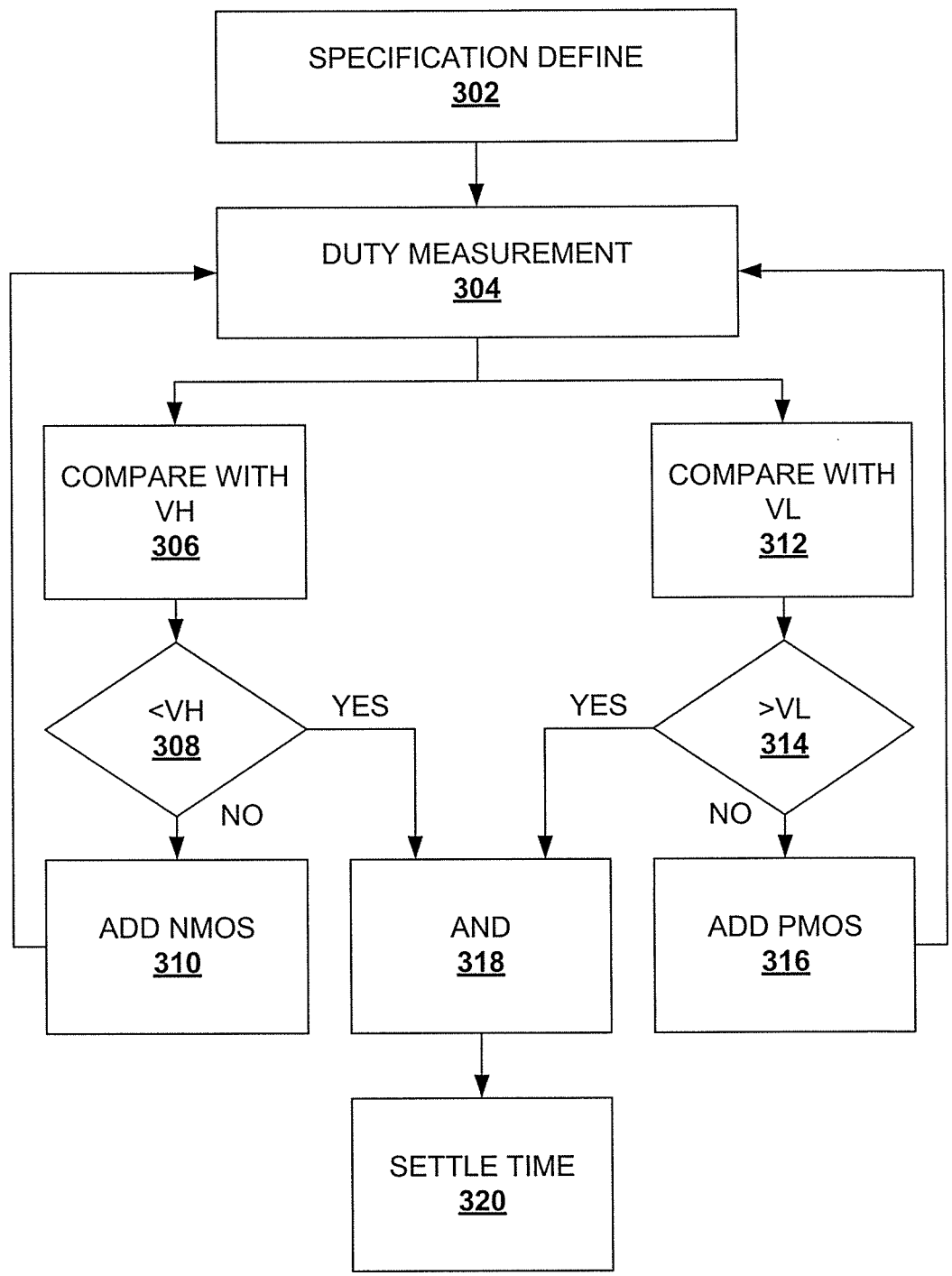
FIG. 3 is a flow diagram illustrating a method of automatically adjusting a duty cycle of a clock signal system in accordance with some embodiments.

FIG. 3 is a flow diagram illustrating a method 300 of automatically adjusting a duty cycle of a clock signal system in accordance with some embodiments.

The method begins at block 302, wherein specifications are defined for the clock signal system. The specifications include a voltage high (VH) and a voltage low (VL) values. The values are selected according to factors including, but not limited to, system demand, and application requirements. In one example, the specifications are provided or input.

A duty cycle measurement is performed at block 304. An output clock signal is measured and converted to a DC signal to produce a duty cycle measurement.

The duty measurement is compared with the VH value at block 306. In one example, a comparator is used. The comparison is evaluated at block 308. If the duty measurement is greater than or equal to the VH value, the method 300 proceeds to block 310. This means that the duty cycle is out of specification and needs adjustment. Otherwise, the method continues to block 318.

At block 310, an NMOS adjustment is generated and implemented, such as by sending the NMOS adjustment to a tuning buffer. The NMOS adjustment is generated by accumulating the comparisons from block 306 and 308. From here, the method returns to block 304 for another duty measurement.

From block 304, the duty measurement is also compared with the VL value at block 312. In one example, a comparator is used. The comparison is evaluated at block 314. If the duty measurement is less than the VL value, the method 300 proceeds to block 316. This means that the duty cycle is out of specification and needs adjustment. Otherwise, the method continues to block 318.

At block 316, a PMOS adjustment is generated and implemented, such as by sending the PMOS adjustment to a tuning buffer. The PMOS adjustment is generated by accumulating the comparisons from block 312 and 314. From here, the method returns to block 304 for another duty measurement.

A determination is made at block 318 that the duty cycle is within the specifications. This means that the duty measurement falls within the boundaries specified by VH and VL. No further adjustments are needed, so the method proceeds to block 320 where the settling time is checked. At block 320, the settling time is evaluated. It is appreciate that the settling time can be specified or determined previously, such as during block 302 of the method 300. Once the settling time has passed, portions of the clock generation system can be shut down to mitigate power consumption.

The method 300 provides suitable duty correction at selected frequencies, including relatively high frequencies such as 3 GHz. Additionally, the method 300 does not introduce Jitter and consumes a relatively small amount of power compared with other techniques used to monitor and control duty cycle of clock signals. Complex and costly components, such as analog to digital converters, digital to analog converters, and MCUs are not required. Further, the method permits defining specifications. Lastly, the method 300 measures duty cycles of clock signals.

Figure 4A:
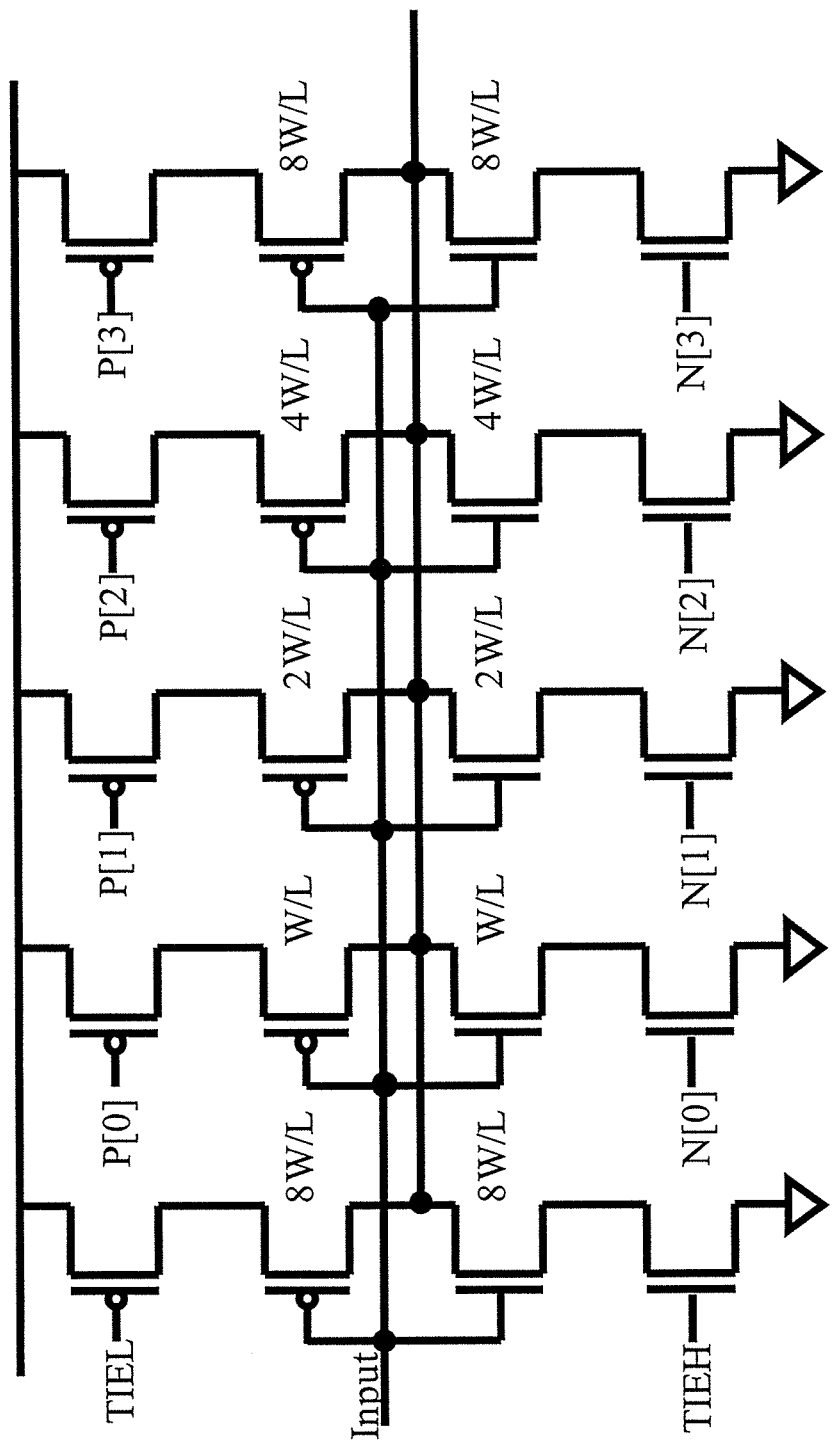
FIG. 4A is a diagram illustrating a tuning buffer in accordance with some embodiments.

FIG. 4A is a diagram illustrating a tuning buffer 400 in accordance with some embodiments. The tuning buffer is utilized to make duty cycle adjustments on a clock signal. In this example, a tri state buffer is used.

A PMOS portion of the buffer 400 receives bits of a PMOS adjustment signal. The PMOS bits are indicated by P[0], P[1], P[2], and P[3], as an example. An NMOS portion of the buffer 400 receives bits of an NMOS adjustment signal. The NMOS bits are similarly indicated by N[0], N[1], N[2], and N[3].

Figure 4B:
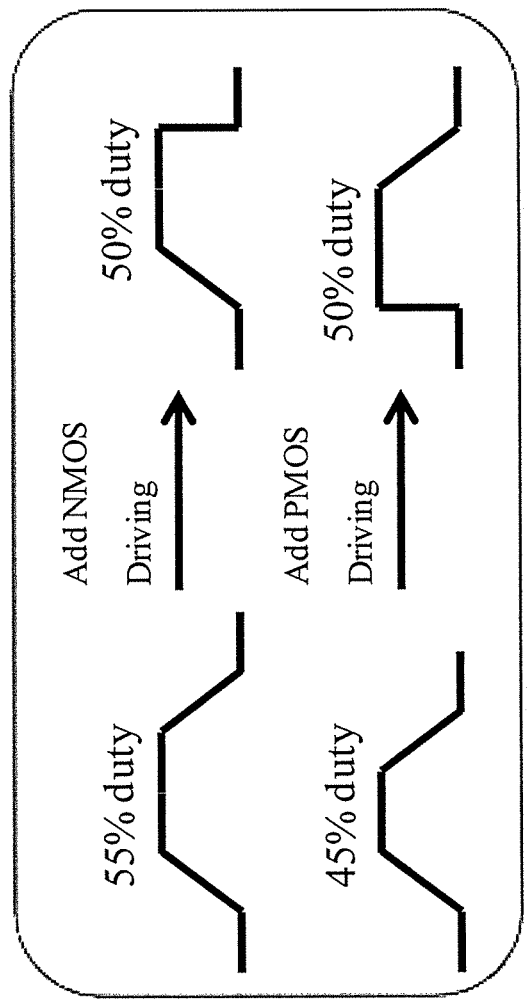
FIG. 4B is a graph illustrating NMOS and PMOS adjustments in accordance with some embodiments.

FIG. 4B is a graph illustrating NMOS and PMOS adjustments 410 in accordance with some embodiments. An upper half depicts NMOS adjustments. A duty cycle measurement corresponding to a 55 percent duty cycle is obtained by a method or technique, such as described above. An NMOS adjustment is made by a tuning buffer, such as the buffer 400 of FIG. 4A and a 50 percent duty cycle clock is obtained as a result.

Similarly, a lower half depicts PMOS adjustments. Another duty cycle measurement corresponding to a 45 percent duty cycle is obtained by a method or technique, such as described above. A PMOS adjustment is made by a tuning buffer, such as the buffer 400 of FIG. 4A and a 50 percent duty cycle clock is obtained.

Figure 5:
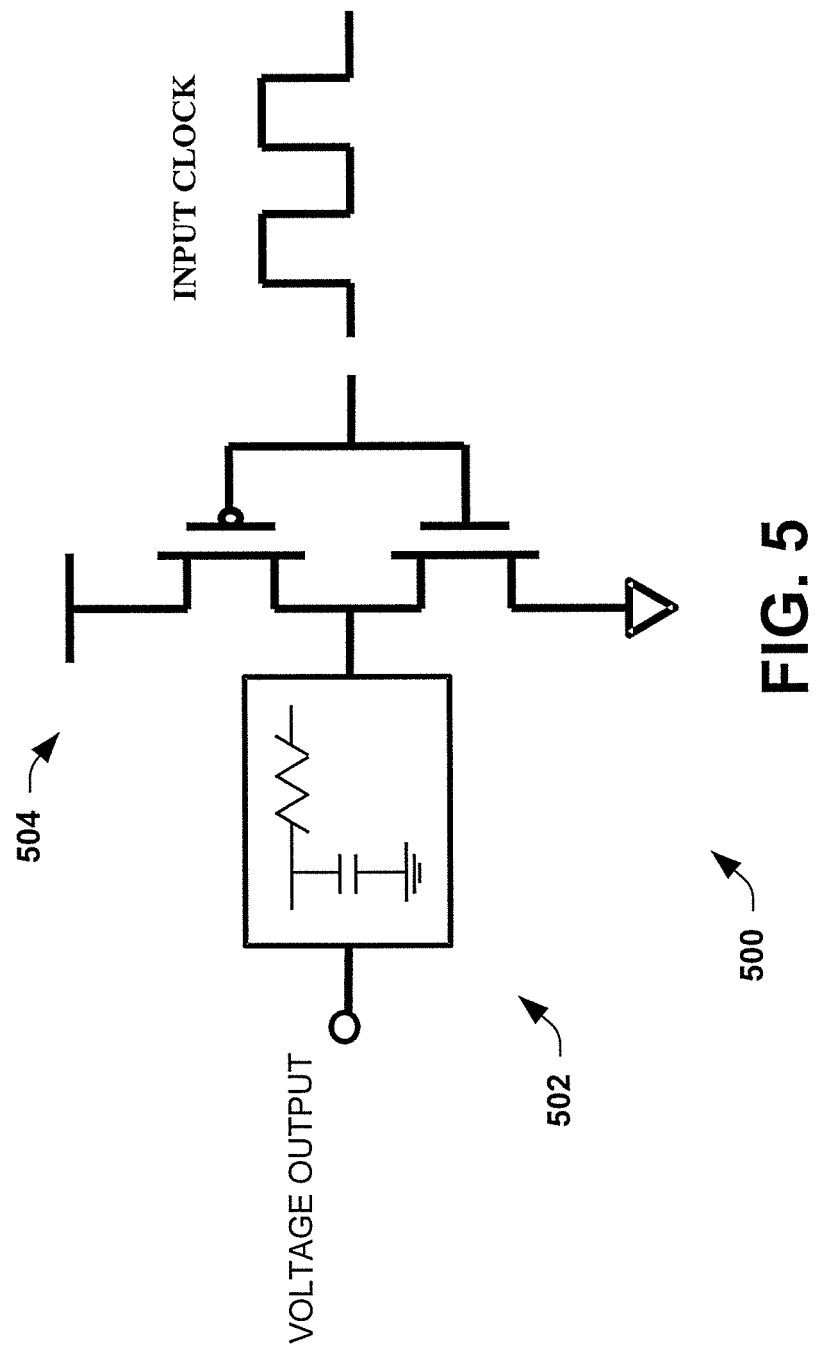
FIG. 5 is a diagram illustrating a duty test circuit in accordance with some embodiments.

FIG. 5 is a diagram illustrating a duty test circuit 500 in accordance with some embodiments. The circuit 500 can be utilized, for example, as the test circuit 110 of FIG. 1, described above.

The circuit 500 includes a voltage measurement component 502 and a MOS component 504. The MOS component 504 includes a PMOS transistor connected in series with an NMOS transistor. Both transistor gates receive or input an input clock signal. For example, the input clock can be the output clock signal discussed above with regard to FIG. 1. The voltage measurement component 502 includes a resistor and a capacitor. The voltage measurement component 502 generates a voltage output based on the input clock. The voltage output is a DC value representing the duty cycle of the input clock. The voltage output is also the duty cycle measurement described above with reference to FIG. 1.

Figure 6:
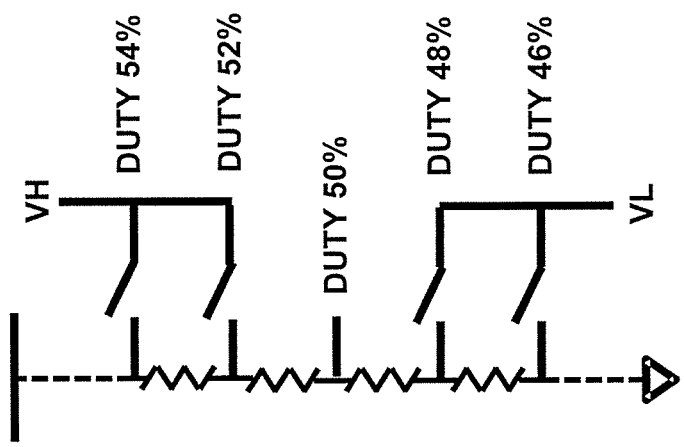
FIG. 6 is a diagram illustrating a specification design component 600 in accordance with some embodiments.

FIG. 6 is a diagram illustrating a specification design component 600 in accordance with some embodiments. The design component 600 is presented with example duty cycle percentages in order to facilitate understanding. However, it is appreciated that these values can be implementation dependent. The design component 600 can be utilized as the specification design component 118 in FIG. 1.

The design component 600 is shown as a resistor based voltage divider circuit. The design component 600 is shown with a setting for a duty cycle of 50 percent in the middle of the resistors. The component 600 includes a VH voltage output and a VL voltage output. Switches are present that can be selected or configured to correspond to various duty cycles. For example, VH can be set to a voltage corresponding to 54 percent or 52 percent duty cycles. As another example, VL can be set to a voltage corresponding to 48 percent or 46 percent duty cycles. The VL and VH values are then provided to an automatic calibration component, such as component 114 of FIG. 1.

It will be appreciated that while reference is made throughout this document to exemplary structures in discussing aspects of methodologies described herein (e.g., the structure presented in Figs. -, while discussing the methodology set forth in FIG. 3), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

The present disclosure relates to a clock generation system. The system includes a clock source, a tuning buffer, an output buffer, a duty cycle measurement circuit and an automatic calibration component. The clock source generates a clock signal. The tuning buffer is configured to generate a corrected clock signal from the clock signal according to adjustment values. The output buffer is configured to generate an output clock signal from the corrected clock signal. The duty cycle measurement circuit is configured measure a duty cycle of the output clock signal. The automatic calibration component is configured to generate the adjustment values according to the duty cycle measurement and the specification values.

The present disclosure also relates to another clock generation system. The system includes a clock source, a tuning buffer, an output buffer, a divider component, a duty cycle measurement circuit, an automatic calibration component, and a specification design component. The clock source is configured to generate a clock signal. The tuning buffer is configured to generate a corrected clock signal from the clock signal according to adjustment values. The output buffer is configured to generate an output clock signal from the corrected clock signal. The divider component is configured to generate a sample clock from the output clock signal. The duty cycle measurement circuit is configured to measure a duty cycle of the output clock signal. The automatic calibration component is configured to generate the adjustment values according to the duty cycle measurement, specification values, and the sample clock. The specification design component is configured to generate the specification values.

The present disclosure also relates to a method of performing automatic duty cycle correction. Specification values are defined according to system specifications. The values correspond to a range of duty cycle percentages. A current duty cycle measurement of an output clock signal is obtained. The current duty cycle measurement is compared with the specification values. On the measurement being outside the specification values, an adjustment value is generated. The output clock signal is adjusted according to the adjustment value.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A clock generation system comprising:
a clock source configured to generate a clock signal;
a tuning buffer configured to generate a corrected clock signal from the clock signal according to duty cycle adjustment values;
an output buffer configured to generate an output clock signal from the corrected clock signal;
a duty cycle measurement circuit configured to measure a duty cycle of the output clock signal; and
an automatic calibration component configured to generate the duty cycle adjustment values according to the duty cycle measurement and specification values, wherein the specification values correspond to a range of permitted duty cycle variations.

2. The system of claim 1, wherein the specification values include an upper duty cycle limit and a lower duty cycle limit.

3. The system of claim 1, wherein the specification values include a voltage high value and a voltage low value.

4. The system of claim 3, wherein the duty cycle measurement represents a duty cycle of the output clock signal.

5. The system of claim 4, wherein the duty cycle measurement circuit outputs a DC voltage.

6. The system of claim 5, wherein the automatic calibration component is configured to compare the duty cycle measurement with the voltage high value and the voltage low value to determine whether a current duty cycle is within the specification values.

7. The system of claim 6, wherein the adjustment values include upper limit adjustment values and lower limit adjustment values.

8. The system of claim 1, wherein the automatic calibration component comprises a comparator that compares the duty cycle measurement with the specification values and an accumulator that generates the adjustment values.

9. The system of claim 1, wherein the duty cycle measurement circuit comprises a CMOS inverter connected in series to a low pass filter, wherein the low pass filter is configured to filter an output of the CMOS inverter.

10. The system of claim 1, wherein the tuning buffer comprises multiple stages of tri-state buffers.

11. The system of claim 1, wherein the output buffer comprises multiple stages of buffers.

12. The system of claim 1, further comprising a specification design component configured to generate the specification values.

13. The system of claim 12, wherein the specification design component comprises a voltage divider circuit with switches to select the specification values.

14. A clock generation system comprising:
a clock source configured to generate a clock signal;
a tuning buffer configured to generate a corrected clock signal from the clock signal according to duty cycle adjustment values;
an output buffer configured to generate an output clock signal from the corrected clock signal;
a feedback path extending from an output of an output buffer to the tuning buffer, and comprising:
a duty cycle measurement circuit configured to measure a duty cycle of the output clock signal; and
an automatic calibration component configured to generate the duty cycle adjustment values according to the duty cycle measurement and specification values, wherein the specification values correspond to a range of permitted duty cycle variations.

15. The system of claim 14,
wherein the specification values include a voltage high value and a voltage low value; and
wherein the automatic calibration component comprises an upper comparator configured to generate an upper comparison value according to the duty cycle measurement and the voltage high value and a lower comparator configured to generate a lower comparison value according to the duty cycle measurement and the voltage low value.

16. The system of claim 15, further comprising:
a divider component configured to generate a sample clock from the output clock signal;
wherein the automatic calibration component further comprises an upper accumulator configured to generate NMOS driving adjustments of the adjustment values according to the upper comparison value and the sample clock.

17. The system of claim 16, wherein the automatic calibration component further comprises a lower accumulator configured to generate PMOS driving adjustments of the adjustment values according to the lower comparison value and the sample clock.

18. The system of claim 17, wherein the tuning buffer comprises a PMOS driving portion configured to receive the PMOS driving adjustments and an NMOS driving portion configured to receive the NMOS driving adjustments.

19. A method of performing automatic duty cycle correction for a clock generation system, the method comprising:
defining specification values according to system specifications, wherein the specification values correspond to a range of duty cycle percentages;
obtaining a current duty cycle measurement of an output clock signal;
comparing the duty cycle measurement with the specification values;
on the duty cycle measurement being outside the specification values, generating an adjustment value; and
adjusting the duty cycle of the output clock signal according to the adjustment value.

20. The method of claim 19, further comprising maintaining the current duty cycle of the output clock signal on the duty cycle measurement being within the specification values.

* * * * *